United States Patent
Chen (10) Patent No.: US 9,052,728 B2
(45) Date of Patent: Jun. 9, 2015

(54) START-UP CIRCUIT AND METHOD THEREOF

(71) Applicant: Silergy Semiconductor Technology (Hangzhou) LTD, Hangzhou, ZheJiang Province (CN)

(72) Inventor: Wei Chen, Saratoga, CA (US)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 217 days.

(21) Appl. No.: 13/939,520

(22) Filed: Jul. 11, 2013

(65) Prior Publication Data

US 2013/0293213 A1 Nov. 7, 2013

Related U.S. Application Data

(63) Continuation of application No. 13/134,143, filed on May 31, 2011, now Pat. No. 8,531,851.

(30) Foreign Application Priority Data

Jun. 25, 2010 (CN) .......................... 2010 1 0214065

(51) Int. Cl.
*H02M 1/36* (2007.01)
*G05F 1/10* (2006.01)
*H02M 1/32* (2007.01)
(Continued)

(52) U.S. Cl.
CPC . *G05F 1/10* (2013.01); *H02M 1/32* (2013.01); *H02M 1/36* (2013.01); *H02M 2001/0025* (2013.01); *H03K 17/0822* (2013.01); *H03K 17/223* (2013.01); *H03K 17/166* (2013.01)

(58) Field of Classification Search
CPC ............ H02M 1/36; G05F 1/56; G05F 1/565; G05F 1/569; G05F 1/571; G05F 1/573
USPC ......... 323/273, 274, 275, 276, 277, 279, 282, 323/901; 363/49
See application file for complete search history.

(56) References Cited

U.S. PATENT DOCUMENTS 5,381,082 A * 1/1995 Schlicht ........................ 323/280
5,886,512 A * 3/1999 Becerra ......................... 323/282
(Continued)

OTHER PUBLICATIONS

Datasheet, "NCP102 Low Dropout Linear Regulator Controller," Jan. 2008, Semiconductor Components Industries, LLC.*
(Continued)

*Primary Examiner* — Adolf Berhane
*Assistant Examiner* — Jye-June Lee
(74) *Attorney, Agent, or Firm* — Michael C. Stephens, Jr.

(57) ABSTRACT

Methods and circuits related to power regulator start-up are disclosed. In one embodiment, a start-up circuit can include: (i) a delay circuit having a resistor and a capacitor, where the capacitor is coupled between ground and a common node; and (ii) a control chip that receives a reference voltage, and includes an input pin coupled to an input source, an output pin supplying power for a device, and a multiplexed pin coupled to the resistor at the common node to receive an enable signal. The start-up circuit outputs an electrical signal at the output pin based on a comparison of a voltage at the multiplexed pin against the reference voltage, and after a delay time determined by the capacitor and the reference voltage. The voltage at the multiplexed pin can increase continuously with a rising slope determined by input current flowing through the multiplexed pin during a start-up process.

14 Claims, 6 Drawing Sheets

(51) Int. Cl.
  *H03K 17/082* (2006.01)
  *H03K 17/22* (2006.01)
  *H03K 17/16* (2006.01)
  *H02M 1/00* (2006.01)

(56) References Cited

U.S. PATENT DOCUMENTS

| | | | | |
|---|---|---|---|---|
| 6,639,483 | B2* | 10/2003 | Chou | 363/15 |
| 7,859,862 | B2* | 12/2010 | Lin | 363/56.01 |
| 8,120,343 | B2* | 2/2012 | Kunimatsu | 363/49 |
| 2007/0171687 | A1* | 7/2007 | Kogel et al. | 363/49 |
| 2009/0268488 | A1* | 10/2009 | Fujii | 363/49 |
| 2011/0316509 | A1* | 12/2011 | Chen | 323/282 |

OTHER PUBLICATIONS

NCP102 ("NCP102/D Low Dropout Linear Regulator Controller," Datasheet [online], ON Semiconductor, Jan 2008—Rev. 1, retrieved from the Internet: <URL : http://www.onsemi.com/pub_link/Collateral/NCP102-D.PDF>.

JOJO (JOJO, "Op-Amp Comparator," Sep. 21, 2009, retrieved from the Internet: <URL : http://www.circuitstoday.com/op-amp-comparator>.

\* cited by examiner

FIG. 1 (conventional)

START-UP CIRCUIT AND METHOD THEREOF

RELATED APPLICATIONS

This application is a continuation of the following application, U.S. patent application Ser. No. 13/134,143, entitled "START-UP CIRCUIT AND METHOD THEREOF," filed on May 31, 2011, and which is hereby incorporated by reference as if it is set forth in full in this specification, and which also claims the benefit of Chinese Patent Application No. CN201010214065.8, filed on Jun. 25, 2010, which is incorporated herein by reference in its entirety.

FIELD OF THE INVENTION

The present invention generally relates to the field of power regulating devices. More specifically, embodiments of the present invention pertain to a start-up circuit for a power regulator.

BACKGROUND

With extensive use of portable electronic devices in the areas of communication, computer, and consumer electronic products, etc., there is an increasing need for power management integrated circuits or ICs (e.g., DC-to-DC switch power supplies, AC-to-AC switch power supplies, etc.). Further, as electronic systems become more complicated, better performance for both sequencing and smoothness during the start-up or powering on process of such power management circuits becomes more important. For example, in a relatively complicated electronic system (e.g., a laptop), a plurality of power supplies may be utilized, each of which may supply multiple loads (e.g., digital chips in the electronic system) simultaneously.

In addition, a power voltage of each digital chip may need a relatively large filter capacitor to obtain a smooth power voltage to maintain a proper operating condition. Generally, a starting switch is used to reduce standby loss, and different power voltages should have different power sequences in order to guarantee a normal start-up for the system, and thus such starting switches should also accordingly regulate the start-up delay time. Because the voltage of the filter capacitor is zero at the beginning of the start-up process, a heavy inrush current may occur due to the instantaneous surge to the power supply from the filter capacitor. For example, the filter capacitor for a digital chip may be large enough to generate an inrush current of as much as 100 A. As a result, it may be necessary to limit the inrush current during the start-up process in order to prevent damage to the power switch of the power management circuit. However, abnormal operation of the switch power in view of the huge inrush current can occur at the moment of powering on the voltage regulator or power management chip.

SUMMARY

Embodiments of the present invention relate to start-up circuits with delay time control and current-limiting protection by use of a multiplexed pin of an integrated chip via an external RC delay circuit, and a continuous output voltage with a fixed rising slope.

In one embodiment, a start-up circuit can include: (i) a delay circuit having a first resistor and a first capacitor, where the first capacitor is coupled between ground and a common node; and (ii) a control chip that receives a first reference voltage, where the control chip includes an input pin coupled to an input voltage source, an output pin that supplies power for a post device, and a multiplexed pin coupled to the first resistor at the common node to receive an external enable signal. The start-up circuit outputs an electrical signal at the output pin in response to the external enable signal being activated, and based on a comparison of a voltage at the multiplexed pin against the first reference voltage, and after a delay time that is determined by a value of the first capacitor and the first reference voltage. The voltage at the multiplexed pin can increase continuously with a fixed rising slope that is determined by input current flowing through the multiplexed pin during a start-up process for the start-up circuit.

In another embodiment, a start-up method can include: (i) transferring an external enable signal to a multiplexed pin of a control chip via a first resistor, where the control chip includes a multiplexed pin, an input pin, an output pin, and a first reference voltage; (ii) determining a delay time using a first capacitor and the first reference voltage, where the first capacitor is coupled between ground and a common node of the first resistor and the multiplexed pin; (iii) comparing a voltage at the multiplexed pin against the first reference voltage to output an electrical signal after the delay time when the voltage at the multiplexed pin is higher than the first reference voltage, the electrical signal continuously increasing during a start-up process; (iv) comparing the voltage of the multiplexed pin against a second reference voltage, and clamping the voltage at the multiplexed pin to the second reference voltage when the voltage of the multiplexed pin is higher than the second reference voltage, and the first reference voltage is lower than the second reference voltage by a predetermined amount; and (v) generating an output voltage at the output pin with a rising slope that is determined by an input current of the multiplexed pin and an output capacitor receiving an output current of the output pin. Alternatively, the voltage at the multiplexed pin may be clamped to the second reference voltage when the voltage of the multiplexed pin is higher than the second reference voltage, and the first reference voltage is lower than the second reference voltage by the predetermined amount.

Embodiments of the present invention can advantageously provide both accurate control for the delay time of powering on, and current limit protection. The number of pins, and also the area of the control chip can decrease because start-up delay time control and current-limiting protection may share a common multiplexed pin of the integrated control chip. In addition, the output voltage of the start-up circuit can achieve a slow increase at a rising slope to avoid the output voltage overshoot during the start-up process, which may cause damage or poor influence to the post circuit at the output pin. Other advantages of the present invention will become readily apparent from the detailed description of preferred embodiments below.

DETAILED DESCRIPTION

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Embodiments of the present invention can advantageously provide both accurate control for the delay time of powering on, and current limit protection. The number of pins, and also the area of the control chip can decrease because start-up delay time control and current-limiting protection may share a common multiplexed pin of the integrated control chip. In addition, the output voltage of the start-up circuit can achieve a slow increase at a rising slope to avoid the output voltage overshoot during the start-up process, which may cause damage or poor influence to the post circuit at the output pin. The invention, in its various aspects, will be explained in greater detail below with regard to exemplary embodiments.

Figure 1:
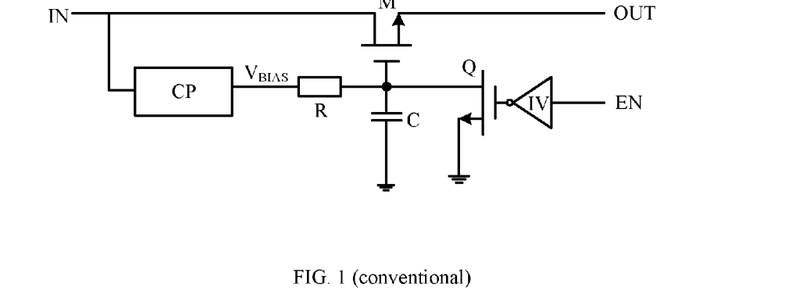
FIG. 1 is a block schematic diagram of an example start-up circuit.

In one example start-up circuit implementation shown in FIG. 1, the start-up delay is achieved by using a topology including a charge pump CP, a signal switch Q, a power switch M, an inverter IV, and a RC delay circuit made up of a resistor (R) and a capacitor (C). When the enable signal is activated (e.g., at a logic high level), the signal switch Q is turned off, the capacitor C1 is continuously charged by the charge pump CP, and the gate voltage of power switch M continuously increases. After a certain delay time, power switch M turns on when the gate voltage becomes higher than a threshold voltage of the power switch, and then the start-up circuit outputs a voltage signal at OUT. When the enable signal is at a logic low level, the signal switch Q turns on, the power switch M turns off, and as a result the start-up circuit is disabled without driving an output voltage at OUT.

However, one drawback of this approach is a relatively large number of discrete components, and a resulting larger area occupied by these discrete components. Another drawback of this approach is relatively inaccurate control for the delay time due to the discreteness of the gate threshold voltage of the power switch M by the delay circuit formed by a resistor and a capacitor. Another drawback of this approach is a relatively large inrush current generated at the moment of instantaneous switch-on or the sudden large change in the enable signal when powered on, which may cause damage to the electrical components of the powered chips, and thus reduce the input voltage source, which may result in the instantaneous power-off of other devices that use this same input voltage source.

In order to overcome the relatively inaccurate control for the delay time and the absence of current-limiting protection, which may cause many hidden danger to its post-stage circuit, various embodiments of the present invention may be utilized.

Figure 2:
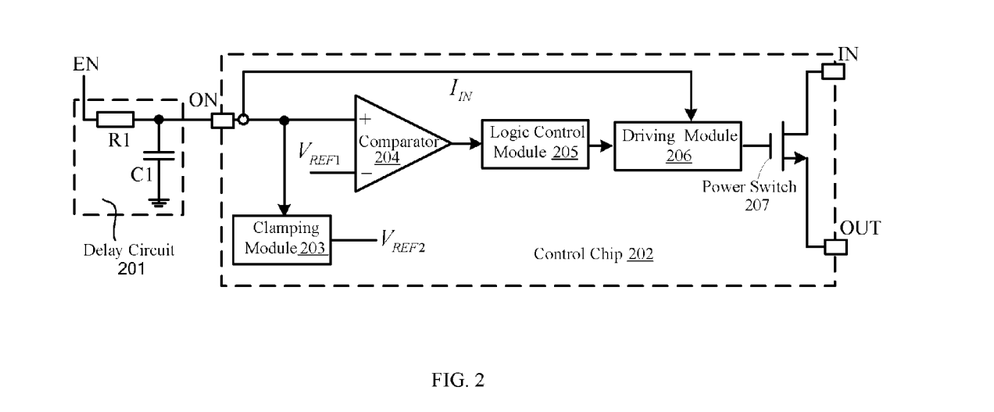
FIG. 2 is a block schematic diagram of a first example start-up circuit in accordance with embodiments of the present invention.

Referring now to FIG. 2, shown is a block schematic diagram of a first example start-up circuit in accordance with embodiments of the present invention. The start-up circuit can include delay circuit 201 and control chip 202, which can include a multiplexed pin (ON), an input pin (IN), and an output pin (OUT). Control chip 202 can also include clamping module 203, comparator 204, logic control module 205, driving module 206, and power switch 207. Comparator 204 may compare a voltage at the multiplexed pin against first reference voltage $V_{REF1}$ to determine a delay time. Clamping module 203 may receive second reference $V_{REF2}$ and clamp the voltage at the multiplexed pin to the second reference voltage $V_{REF2}$. Delay circuit 201 can include first resistor R1 with one terminal connected to an external enable, and first capacitor C1 with one terminal connected to the other terminal of the first resistor R1 and the other terminal of capacitor C1 grounded. The multiplexed pin ON can connect to a common node between first resistor R1 and first capacitor C1.

Power switch 207 may be implemented using any suitable transistor technology (e.g., N-type metal oxide semiconductor transistor (MOSFET) or NMOS, P-type MOSFET (PMOS), NPN or PNP bipolar junction transistor (BJT), etc.). Taking the example that the power switch 207 is chosen as an NMOS, and a logic high level digital signal represents an activated signal state, the example start-up circuit of FIG. 2 will be described in more detail hereinafter.

The multiplexed pin ON can be coupled to clamping module 203 and the positive input of comparator 204 inside control chip 202. If the voltage at multiplexed pin ON is higher than second reference voltage $V_{REF2}$ at clamping module 203, clamping module 203 may clamp the voltage at the multiplexed pin ON to second reference voltage $V_{REF2}$.

First reference voltage $V_{REF1}$ may be input into the negative input terminal of comparator 204, and $V_{REF1}$ may be slightly lower than second reference voltage $V_{REF2}$ (e.g., by less than a predetermined amount). The output of comparator 204 can connect to logic and control module 205, and the output of logic and control module 205 can connect to driving module 206. The output of driving module 206 can connect to the gate of power switch 207, the drain of power switch 207 can connect to the input pin IN, and the source of power switch 207 can connect to the output pin OUT. The input current of the multiplexed pin ON may be sensed by clamping module 203, and then transferred to driving module 206 to control the rising slope of the output voltage at the output pin OUT during the start-up process.

When the enable signal EN is at a logic high level (e.g., about 3.3V), first capacitor C1 may continuously be charged via first resistor R1, such that the voltage across first capacitor C1 continuously increases, and accordingly the voltage at multiplexed pin ON continuously increases. For example, if second reference voltage $V_{REF2}$ of clamping module 203 is about 1.2V and first reference voltage $V_{REF1}$ of comparator 204 is about 1.199V (or $V_{REF1}$ is slightly less than $V_{REF2}$), when the voltage at multiplexed pin ON is less than $V_{REF1}$ of 1.199V, clamping module 203 may not be effective, and the output of comparator 204 can maintain power switch 207 off. However, after a delay time t, when the voltage across first capacitor C1 increases to 1.199V, and accordingly the voltage at the multiplexed pin ON increases to 1.199V, the output of comparator 204 turns power switch 207 on. While the voltage at multiplexed pin ON continues to rise, clamping module 203 may start to clamp the voltage at multiplexed pin ON to the second reference voltage $V_{REF2}$ (e.g., about 1.2V). Accordingly, the delay time t may be determined by first capacitor C1 and first reference voltage $V_{REF1}$.

The input current of the multiplexed pin ON can be calculated according to the following Equation (1):

$$I_{IN} = \frac{EN - V_{REF2}}{R1} \quad (1)$$

A controllable rising status of the gate-to-source voltage of power switch 207 can be achieved by driving module 206 based on the input current $I_{IN}$ transferred to driving module 206 and via clamping module 203. Additionally, an external output capacitor can be arranged to connect to the output pin OUT. When the output capacitor is charged by the output current of power switch 207, the output voltage across the output capacitor may increase continuously with a substantially fixed slope to avoid instantaneous current overshoot of the power supply that might otherwise cause damage or adverse effect to normal regulator operation. The rising slope may be determined by the input current of the multiplexed pin ON and the output capacitor.

Thus, the example start-up circuit of FIG. 2 can take the advantage of accurate control for the delay time set by first capacitor C1 and first reference voltage $V_{REF1}$ and achievement of the output voltage with a slow rising slope by the output capacitor coupled to the output pin OUT. In addition, the slow rising slope can be adjusted by the value of the first resistor R1 or the output capacitor.

Figure 3:
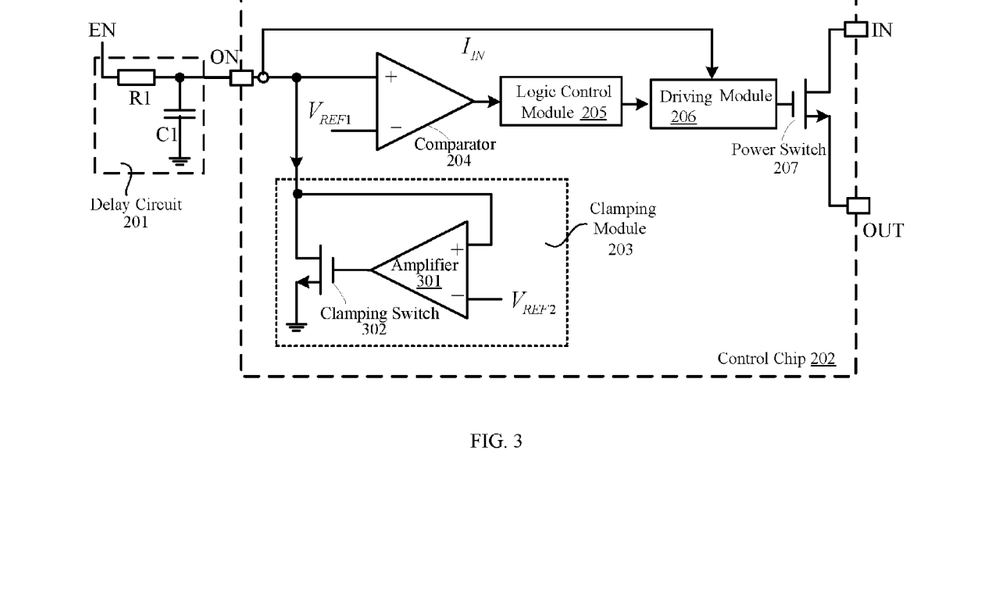
FIG. 3 is a block schematic diagram of a second example start-up circuit in accordance with embodiments of the present invention.

Referring now to FIG. 3, shown is a schematic diagram of a specific implementation of clamping module 203 shown in FIG. 2. Clamping module 203 can include first amplifier 301 and clamping switch 302. For example, clamping switch 302 may be implemented as an NMOS device, and first amplifier 301 can be arranged with its positive input terminal connected to multiplexed pin ON, the negative input terminal connected to the second reference voltage $V_{REF2}$, and the output terminal connected to the gate of clamping switch 302 to drive clamping switch 302. Also, the drain of clamping switch 302 can be connected to the multiplexed pin ON and the source of clamping switch 302 may be connected to ground.

When the enable signal EN goes high (e.g., a logic high level), first capacitor C1 may continuously be charged via first resistor R1, such that the voltage across first capacitor C1 continuously increases, and accordingly the voltage at the multiplexed pin ON continuously increases. When the voltage at multiplexed pin ON is lower than second reference voltage $V_{REF2}$, clamping module 203 may not be effective. After a certain delay time t, the voltage across first capacitor C1 can increase to the level of second reference voltage $V_{REF2}$, and accordingly the voltage at multiplexed pin ON may increase to the second reference voltage $V_{REF2}$. In this fashion, clamping module 203 may be effective at clamping the multiplexed pin ON to the second reference voltage $V_{REF2}$.

The voltage of multiplexed pin ON may be transferred to the positive input terminal of first amplifier 301. The voltage of the positive input terminal of first amplifier 301 may be clamped to the voltage of the negative input terminal of first amplifier 301 because of the 'virtual short' amplifier principle, thereby the voltage at the multiplexed pin ON is clamped to the second reference voltage $V_{REF2}$. Furthermore, the input current of clamping switch 302 in keeping with the input current $I_{IN}$ of the multiplexed pin ON may be transferred to driving module 206, and driving module 206 can control power switch 207 according to the input current $I_{IN}$ to make the output voltage of the external output capacitor keep increasing slowly with a rising slope during the start-up process.

On the other hand, if the external enable signal is active when it is at logic low level, clamping module 203 shown in FIG. 2 may clamp the voltage at the multiplexed pin ON to not be lower than second reference voltage $V_{REF2}$. When the voltage at the multiplexed pin ON is lower than first reference voltage $V_{REF1}$, comparator 204 may generate an electrical signal at the output pin OUT when the voltage at the multiplexed pin ON is lower than first reference voltage $V_{REF1}$. The rising slope of the output voltage can be adjusted by sensing the input current at the multiplexed pin for the start-up circuit in the same way as discussed above.

Figure 4:
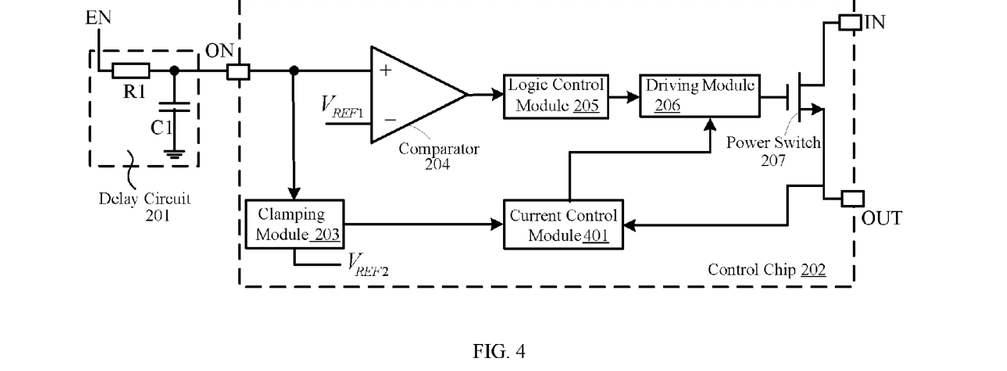
FIG. 4 is a block schematic diagram of a third example start-up circuit in accordance with embodiments of the present invention.

Referring now to FIG. 4, shown is a block schematic diagram of a second example start-up circuit in accordance with embodiments of the present invention. Current control module 401 can connect to multiplexed pin ON (e.g., via clamping module 203) and the output of power switch 207. Current control module 401 may also receive the input current $I_{IN}$ of the multiplexed pin ON (e.g., via clamping module 203, driving module 206, or a current sensor) and the output current $I_{OUT}$ of power switch 207. Current control module 401 can connect to driving module 206 to regulate the output current $I_{OUT}$ of power switch 207 during the start-up process so as to avoid the inrush current.

Figure 5:
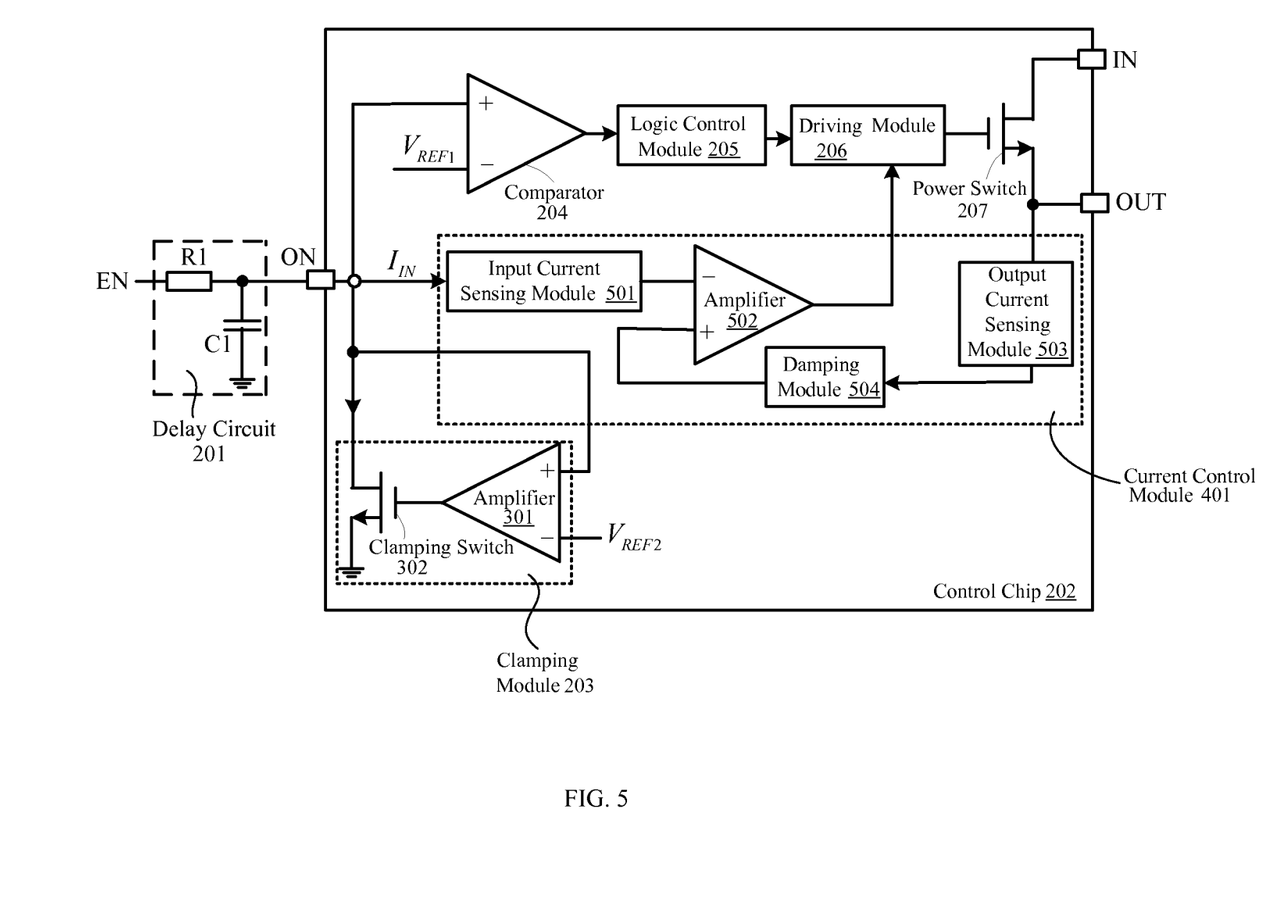
FIG. 5 is a block schematic diagram of a fourth start-up circuit in accordance with embodiments of the present invention.

Referring now to FIG. 5, shown is a schematic diagram of a specific implementation of current control module 401 of the start-up circuit shown in FIG. 4. Current control module 401 can include input current sensing module 501 coupled to the multiplexed pin ON (e.g., via a current sensor) to receive input current $I_{IN}$ flowing through the multiplexed pin ON. Current control module 401 can also include output current sensing module 503 coupled to power switch 207 to sense the output current $I_{OUT}$. Current control module 401 can also include second amplifier 502 to receive one current signal indicating the input current $I_{IN}$ by the positive input terminal, and the other current signal indicating the output current $I_{OUT}$ by the negative input terminal. The comparison result of the two current signals may be input into driving module 206 to control the gate-to source voltage of power switch 207. In this fashion, the relationship between the input current $I_{IN}$ and the output current $I_{OUT}$ may be used to effectively control the output current of power switch 207.

Current control module 401 can further include damping module 504 connected to the output current sensing module 503 and second amplifier 502 to decay the sensed output current, and then transfer the decayed sensed output current to second amplifier 502 to continue the follow-up control operation.

One example operational process of this example start-up circuit can be divided into three parts according to the operation status of power switch 207. For this particular example, the first reference voltage may be about 1.199V, the second reference voltage may be about 1.2V, and the peak voltage of enable signal EN may be about 3.3V.

In the first operational part example, the output voltage may be zero. When the start-up circuit is powered on, first capacitor C1 can be charged by enable signal EN via first resistor R1. The voltage across first capacitor C1 can increase continuously, thereby the voltage at multiplexed pin ON increases continuously. During the delay time t, when the voltage across first capacitor C1 is lower than first reference voltage $V_{REF1}$ of about 1.199V, the output of comparator 204 may keep the power switch 207 off. During this time, there may be no output current at the output pin OUT. The start-up circuit may thus be out of operation and there is no output current during the delay time t.

In the second operational part example, the output voltage keeps rising. After the delay time t, when the voltage across first capacitor C1, same as the voltage at the multiplexed pin ON, increases to first reference voltage $V_{REF1}$ (e.g., about 1.199V), the output of comparator 204 turns power switch 207 on, and there is an output signal at the output pin OUT. While the voltage across first capacitor C1 continuously rises to the second reference voltage (e.g., about 1.2V), clamping module 203 starts to work. The voltage at the multiplexed pin ON may be transferred to the positive input terminal of first amplifier 301, and then be clamped to the voltage of the negative input terminal (e.g., at the second reference voltage 1.2V) by the clamping switch 302.

After power switch 207 turns on, output current sensing module 503 can sense the output current $I_{OUT}$ of the power switch 207, and input current sensing module 501 can sense the current at clamping switch 302, namely the input current $I_{IN}$ of the multiplexed pin ON. The second amplifier 502 can compare the input current $I_{IN}$ transferred to the negative input terminal and the output current $I_{OUT}$ transferred to the positive input terminal, and the comparison result may be transferred to driving module 206 to control the gate-source voltage $V_{GS}$ of the power switch 207.

When the gate-source voltage $V_{GS}$ of the power switch 207 (e.g., power switch 207 is implemented as an NMOS device) is lower than its saturation threshold voltage, power switch 207 may be in an un-saturated status, and the current of the drain $I_D$ increases continuously with the increase of the gate-source voltage. Thereby, during the process that the gate-source voltage of power switch 207 increases gradually from zero to saturation limiting voltage, if sensed output current $I_{OUT}$ is higher than the first current limiting threshold that is determined by the input current $I_{IN}$, driving module 206 can control the gate-source voltage $V_{GS}$ of power switch 207 to decrease, thus the drain current $I_D$, namely the output current $I_{OUT}$ decreases accordingly. However, if the sensed output current $I_{OUT}$ is lower than the first current limiting threshold that is determined by the input current $I_{IN}$, driving module 206 can control the gate-source voltage $V_{GS}$ of power switch 207 to increase, thus the drain current $I_D$ (the output current $I_{OUT}$) may increase to keep the output current $I_{OUT}$ in the process of start-up consistent with the first current limiting threshold that is determined by the input current $I_{IN}$.

In the third operational part example, the output voltage reaches a steady condition. After the gate-source voltage $V_{GS}$ of power switch 207 increases to saturation limiting voltage of the NMOS transistors, power switch 207 may be in a saturation state, and the output voltage at the output pin OUT may be consistent with the voltage at the input pin. If the output current $I_{OUT}$ is too large, current control module 401 can also limit the output current to be no higher than the second current limiting threshold that is determined by the input current $I_{IN}$. Generally, the second current limiting threshold can be in proportion or equal to the first current limiting threshold.

Additionally, after enabling the start-up circuit, the voltage of the gate of power switch 207 may begin to increase. In order to maintain a normal operation, the gate voltage of power switch 207 may be higher than the source voltage. In order to satisfy this condition in the whole range of the supply voltage, a charge pump coupled to driving module 206 can be included. For example, such a charge pump can be set outside of the control chip 202, or be integrated inside of control chip 202.

If the external enable signal is active when it is at a logic low level, the clamping module 203 can be employed to clamp the voltage at the multiplexed pin to no lower than the second reference voltage $V_{REF2}$ as shown in FIG. 4, and comparator 204 may be effective to output an electrical signal only on the condition that the voltage at the multiplexed pin ON is lower than first reference voltage $V_{REF1}$. The rising slope of the voltage of the output pin can be adjusted by the input current flowing through the multiplexed pin in the same way as discussed above.

One skilled in the art will recognize that other proper types of power switch 207 and clamping switch 302 can also achieve the same functions and operation as discussed above. Reference will now be made in detail to example start-up methods in accordance with embodiments, examples of which are illustrated in the accompanying drawings.

Figure 6:
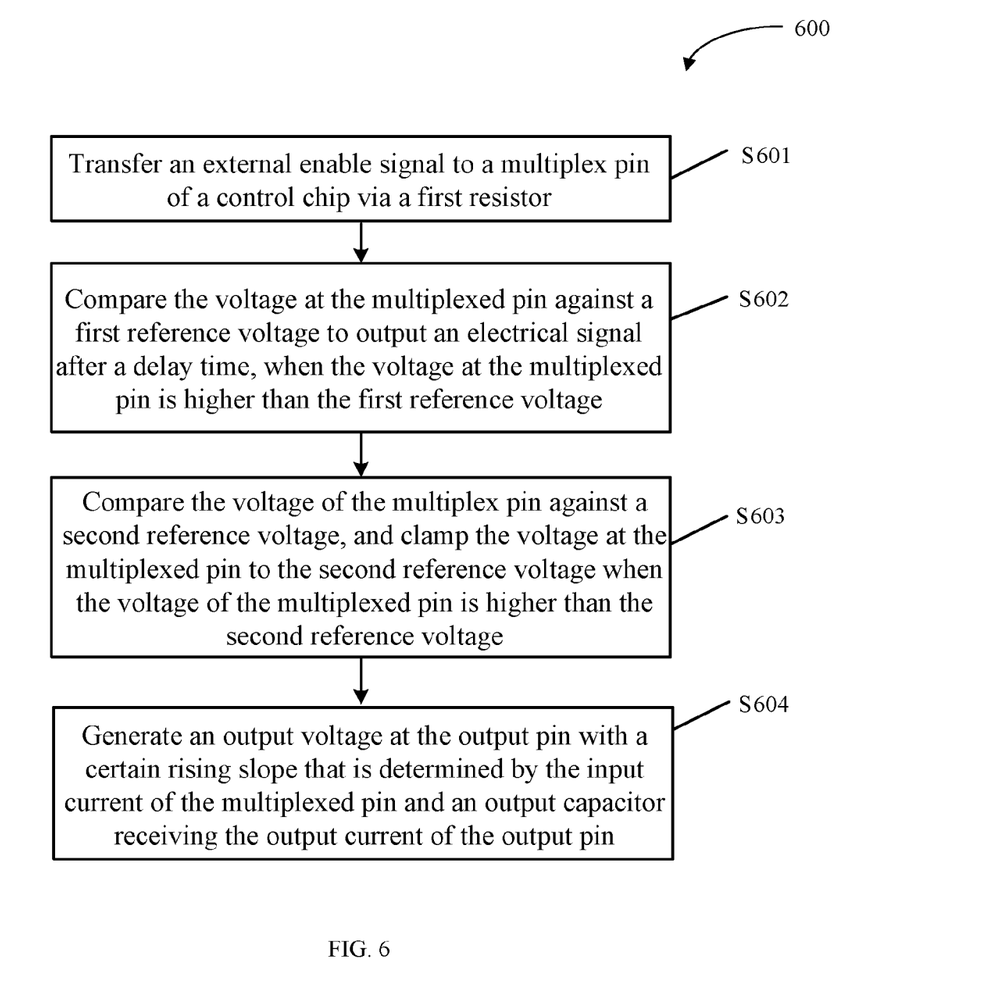
FIG. 6 is a flow diagram of a first example start-up circuit operation in accordance with embodiments of the present invention.

Referring now to FIG. 6, shown is a flow diagram 600 of a first start-up method in accordance with embodiments of the present invention. At S601, an external enable signal may be transferred to a multiplexed pin of a control chip via a first resistor. The control chip can include a first reference voltage, a multiplexed pin, an input pin, and an output pin. At S602, the voltage at the multiplexed pin can be compared against the first reference voltage to output an electrical signal after a delay time, when the voltage at the multiplexed pin is higher than the first reference voltage. The electrical signal can continuously increase during the start-up process.

The delay time may be determined by a first capacitor and a first reference voltage. The first capacitor respectively connects with ground and the node between the first resistor and the multiplexed pin, as shown in the particular circuit examples discussed above. At S603, the voltage of the multiplexed pin can be compared against a second reference voltage, and the voltage at the multiplexed pin can be clamped to the second reference voltage when the voltage of the multiplexed pin is higher than the second reference voltage. For example, the first reference voltage may be slightly lower than the second reference voltage. At S604, an output voltage may be generated at the output pin with a rising slope that is determined by the input current of the multiplexed pin and an output capacitor receiving the output current of the output pin.

Figure 7:
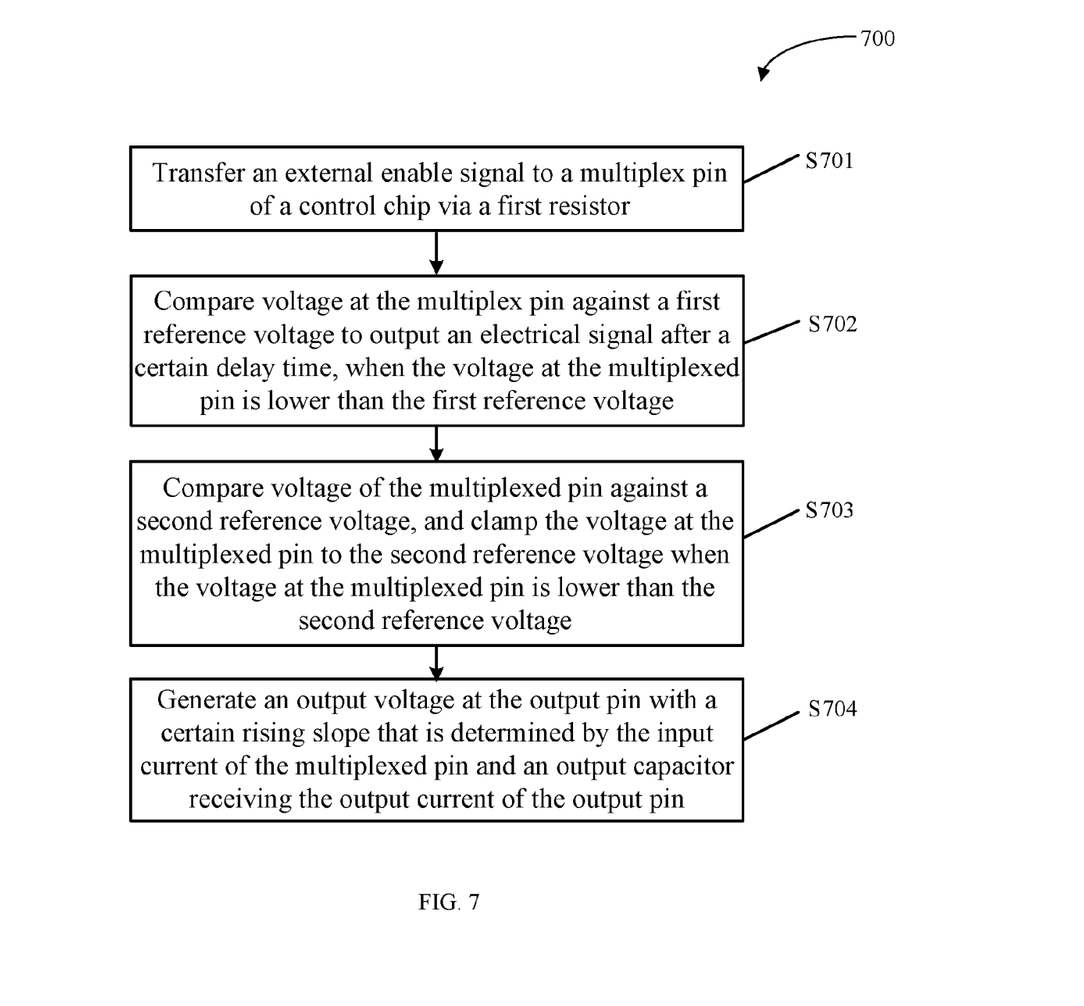
FIG. 7 is a flow diagram of a second example start-up circuit operation in accordance with embodiments of the present invention.

Referring now to FIG. 7, shown is a flow diagram 700 of a second example start-up circuit operation in accordance with embodiments of the present invention. At S701, an external enable signal can be transferred to a multiplexed pin of a control chip via a first resistor. The control chip can include a first reference voltage, a multiplexed pin, an input pin, and an output pin. At S702, the voltage at the multiplexed pin can be compared against the first reference voltage to output an electrical signal after a certain delay time, when the voltage at the multiplexed pin is lower than the first reference voltage. The electrical signal can continuously increase during the start-up process.

For example, the delay time is determined by the first capacitor and the first reference voltage. The first capacitor respectively connects with ground and the node between the first resistor and the multiplexed pin. At S703, the voltage of the multiplexed pin can be compared against the second reference voltage, and the voltage at the multiplexed pin may be clamped to the second reference voltage when the voltage at the multiplexed pin is lower than the second reference voltage. The first reference voltage may be equal to or slightly higher than the second reference voltage (e.g., by a predetermined amount). At S704, an output voltage can be generated at the output pin with a certain rising slope that is determined by the input current of the multiplexed pin and an output capacitor receiving the output current of the output pin.

The control for the delay time from the arrival of enable signal to appearance of the output voltage can be achieved accurately by the settings of the first capacitor coupled to the multiplexed pin and the first reference voltage with example start-up methods as shown in FIG. 6 and FIG. 7.

In order to limit output current, current control steps can be added, e.g., after step S603 in the start-up method shown in FIG. 6. Similarly, such control steps can also be added, e.g., after step S703 in the example start-up method shown in FIG. 7.

Figure 8:
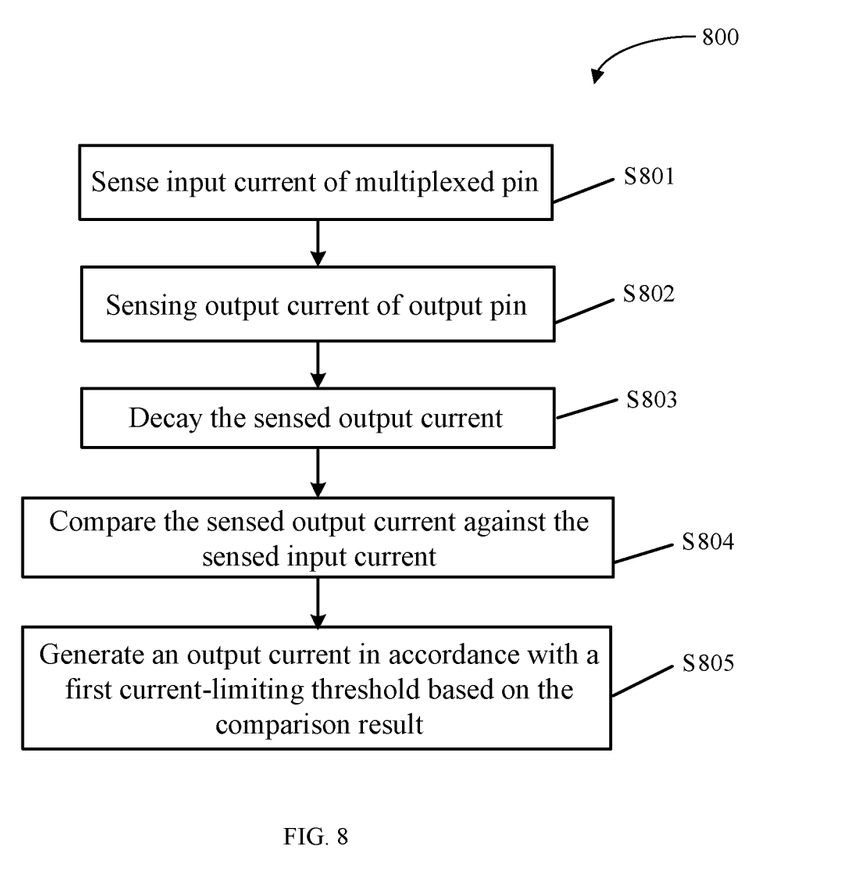
FIG. 8 is a flow diagram of a current control start-up method in accordance with embodiments of the present invention.

Referring now to FIG. 8, shown is a flow diagram 800 of example current control steps for start-up methods in accordance with embodiments of the present invention. At S801, the input current of the multiplexed pin can be sensed. At S802, the output current of the output pin can be sensed. At S803, the sensed output current may be decayed. At S804, the sensed output current may be compared against the sensed input current. At S805, an output current may be generated in accordance with the first current limiting threshold based on the comparison result, where the first current limiting threshold is determined by an input current of the multiplexed pin.

The foregoing descriptions of specific embodiments of the present invention have been presented through images and text for purpose of illustration and description of the start-up circuit and method. They are not intended to be exhaustive or to limit the invention to the precise forms disclosed, and obviously many modifications and variations are possible in light of the above teaching.

The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A start-up circuit, comprising:
   a) a delay circuit comprising a first resistor and a first capacitor, wherein said first capacitor is coupled between ground and a common node, and a multiplexed pin is connected to said common node;
   b) a control chip configured to receive an enable signal at said multiplexed pin, a first reference voltage, and an input voltage source, and to supply power at an output pin;
   c) wherein said start-up circuit is configured to output an electrical signal at said output pin in response to said enable signal being activated, said electrical signal being output at said output pin based on a comparison of a voltage at said multiplexed pin against said first reference voltage, and after a delay time that is determined by a value of said capacitor and said first reference voltage; and
   d) wherein a voltage at said output pin is configured to increase continuously with a fixed rising slope that is determined by input current flowing through said multiplexed pin during a start-up process for said start-up circuit.

2. The start-up circuit of claim 1, wherein said control chip further comprises:
   a) a comparator configured to receive said multiplexed pin and said first reference voltage, and to provide a comparison output to a logic and control module;
   b) a clamping module coupled to said multiplexed pin, wherein said clamping module is configured to clamp said voltage of said multiplexed pin to a second reference voltage;
   c) a driving module configured to receive current from said logic and control module and said clamping module; and
   d) a power switch, wherein a first power switch terminal is configured to receive an output of said driving module, a second power switch terminal is configured to receive a voltage of said input voltage source, and a third power switch terminal is coupled to said output pin to generate an output voltage signal with a fixed rising slope, wherein said fixed rising slope is determined by said input current flowing through said multiplexed pin based on an output of said driving module during said start-up process for said start-up circuit.

3. The start-up circuit of claim 2, further comprising an output capacitor coupled to said third power switch terminal, wherein said output capacitor is configured to receive output current of said power switch, and wherein a voltage across said output capacitor is used as said voltage at said multiplexed pin having a rising slope that is determined by said input current flowing through said multiplexed pin and said output capacitor.

4. The start-up circuit of claim 2, wherein said clamping module is configured to clamp said voltage at said multiplexed pin to said second reference voltage when:
   a) said voltage at said multiplexed pin is higher than said second reference voltage;
   b) said enable signal is at a logic high level; and
   c) said second reference voltage is equal to or higher than said first reference voltage.

5. The start-up circuit of claim 2, wherein said clamping module is configured to clamp said voltage at said multiplexed pin to said second reference voltage when:
   a) said voltage at said multiplexed pin is lower than said second reference voltage;
   b) said enable signal is at a logic low level; and
   c) said second reference voltage is equal to or lower than said first reference voltage.

6. The start-up circuit of claim 2, further comprising a current control module coupled to said third power switch terminal and said multiplexed pin, wherein said current control module is configured to compare a first current signal indicating an output current of said power switch against a second current signal indicating an input current of said multiplexed pin, to control said output current of said power switch during said start-up process for said start-up circuit.

7. The start-up circuit of claim 6, wherein said current control module further comprises:
   a) an input current sensing circuit coupled to said multiplexed pin, said input current sensing circuit being configured to sense current flowing through said multiplexed pin;
   b) an output current sensing circuit coupled to said third power switch terminal, said output current sensing circuit being configured to sense said output current flowing through said power switch; and
   c) an amplifier configured to receive said current flowing through said multiplexed pin and said output current flowing through said power switch, and to provide an output to said driving module to control operation of said power switch;
   d) wherein said driving module is configured to change a gate-to-source voltage of said power switch based on an output of said current control module to limit said output current of said power switch when said sensed output current of said power switch is higher than a first current limiting threshold that is determined by said input current of said multiplexed pin.

8. The start-up circuit of claim 7, wherein said current control module further comprises a damping circuit coupled to said output current sensing circuit, said damping circuit being configured to decay said sensed output current of said power switch and then be transferred to said amplifier.

9. A start-up method, comprising:
   a) transferring an enable signal to a multiplexed pin of a control chip via a resistor, said control chip comprising a multiplexed pin, an input pin, an output pin, and a first reference voltage;
   b) determining a delay time using a capacitor and said first reference voltage, wherein said capacitor is coupled between ground and a common node of said resistor and said multiplexed pin;
   c) comparing a voltage at said multiplexed pin against said first reference voltage to output an electrical signal after said delay time and when said voltage at said multiplexed pin is higher than said first reference voltage, said electrical signal continuously increasing during a start-up process;
   d) comparing said voltage of said multiplexed pin against a second reference voltage, and clamping said voltage at said multiplexed pin to said second reference voltage based on comparisons of said voltage of said multiplexed pin against said second reference voltage, and said first reference voltage against said second reference voltage; and
   e) generating an output voltage at said output pin with a rising slope that is determined by an input current of said multiplexed pin and an output capacitor receiving an output current of said output pin.

10. The method of claim 9, further comprising controlling an output current during said start-up process, wherein said controlling said output current comprises:
    a) sensing said input current of said multiplexed pin;
    b) sensing said output current of said output pin;
    c) comparing said sensed output current against said sensed input current; and
    d) adjusting said output current at said output pin to match a first current limiting threshold, wherein said first current limiting threshold is determined by said input current of said multiplexed pin.

11. The method of claim 10, wherein said controlling said output current further comprises decaying said sensed output current, and comparing said decayed sensed output current against said sensed input current.

12. The method of claim 9, wherein said clamping of said voltage at said multiplexed pin comprises:
    a) clamping said voltage at said multiplexed pin to said second reference voltage when said voltage of said multiplexed pin is higher than said second reference voltage; and
    b) said first reference voltage is lower than said second reference voltage by a predetermined amount.

13. The method of claim 9, wherein said clamping of said voltage at said multiplexed pin comprises:
    a) clamping said voltage at said multiplexed pin to said second reference voltage when said voltage of said multiplexed pin is lower than said second reference voltage; and
    b) said first reference voltage is higher than said second reference voltage by a predetermined amount.

14. An apparatus, comprising:
    a) means for transferring an enable signal to a multiplexed pin of a control chip via a resistor, said control chip comprising a multiplexed pin, an input pin, an output pin, and a first reference voltage;
    b) means for determining a delay time using a capacitor and said first reference voltage, wherein said capacitor is coupled between ground and a common node of said resistor and said multiplexed pin;
    c) means for comparing a voltage at said multiplexed pin against said first reference voltage to output an electrical signal after said delay time and when said voltage at said multiplexed pin is higher than said first reference voltage, said electrical signal continuously increasing during a start-up process;
    d) means for comparing said voltage of said multiplexed pin against a second reference voltage, and clamping said voltage at said multiplexed pin to said second reference voltage based on comparisons of said voltage of said multiplexed pin against said second reference voltage, and said first reference voltage against said second reference voltage; and
    e) means for generating an output voltage at said output pin with a rising slope that is determined by an input current of said multiplexed pin and an output capacitor receiving an output current of said output pin.

* * * * *